United States Patent
Vegelahn

(10) Patent No.: US 12,226,998 B2
(45) Date of Patent: Feb. 18, 2025

(54) DOCTORING UNIT FOR A PRINTING APPARATUS

(71) Applicant: EKRA AUTOMATISIERUNGSSYSTEME GMBH, Bönnigheim (DE)

(72) Inventor: Torsten Vegelahn, Sternenfels (DE)

(73) Assignee: EKRA AUTOMATISIERUNGSSYSTEME GMBH, Bönnigheim (DE)

( * ) Notice: Subject to any disclaimer, the term of this patent is extended or adjusted under 35 U.S.C. 154(b) by 0 days.

(21) Appl. No.: 18/254,000

(22) PCT Filed: Dec. 2, 2021

(86) PCT No.: PCT/EP2021/083995
§ 371 (c)(1),
(2) Date: May 23, 2023

(87) PCT Pub. No.: WO2022/122551
PCT Pub. Date: Jun. 16, 2022

(65) Prior Publication Data
US 2024/0001666 A1    Jan. 4, 2024

(30) Foreign Application Priority Data
Dec. 9, 2020  (DE) .................... 10 2020 215 577.1

(51) Int. Cl.
*B41F 15/46*  (2006.01)
*B41F 15/08*  (2006.01)
*H05K 3/12*   (2006.01)

(52) U.S. Cl.
CPC .......... *B41F 15/46* (2013.01); *B41F 15/0818* (2013.01); *H05K 3/1233* (2013.01); *B41P 2215/50* (2013.01); *H05K 2203/0139* (2013.01)

(58) Field of Classification Search
CPC ... B41F 15/46; B41F 15/0818; H05K 3/1233; H05K 2203/0139; B41P 2215/50
See application file for complete search history.

(56) References Cited

U.S. PATENT DOCUMENTS

2001/0017086 A1   8/2001   Takahashi et al.

FOREIGN PATENT DOCUMENTS

| DE | 196 24 442 A1 | 1/1998 |
| DE | 112019002199 | * 1/2021 |
| JP | H07-329277 A | 12/1995 |

(Continued)

OTHER PUBLICATIONS

International Search Report for corresponding International Application No. PCT/EP2021/083995 mailed Apr. 11, 2022.

(Continued)

*Primary Examiner* — Christopher E Mahoney
*Assistant Examiner* — Marissa Ferguson-Samreth
(74) *Attorney, Agent, or Firm* — Chrisman Gallo Tochtrop LLC

(57) ABSTRACT

The application relates to a doctoring unit for a printing apparatus for printing flat substrates, in particular circuit boards, wafers, or solar cells, comprising two doctor blades, which extend parallel to one another and are pivotably mounted. It is provided that the doctor blades are operatively connected to a gearing, which is formed in a self-locking manner and can be coupled or is coupled to a drive device.

18 Claims, 4 Drawing Sheets

(56) References Cited

FOREIGN PATENT DOCUMENTS

| | | | |
|---|---|---|---|
| JP | H08-197712 A | | 8/1996 |
| JP | 2013-018123 A | | 1/2013 |
| KR | 200412044 | * | 3/2006 |
| KR | 20190052775 | * | 11/2017 |
| KR | 10-2019-0052775 A | | 5/2019 |

OTHER PUBLICATIONS

Written Opinion for corresponding International Application No. PCT/EP2021/083995 dated Apr. 11, 2022.
International Preliminary Report on Patentability for corresponding International Application No. PCT/EP2021/083995 dated Nov. 16, 2022.
International Preliminary Report on Patentability for corresponding International Application No. PCT/EP2021/083995 mailed Nov. 16, 2022.

* cited by examiner

DOCTORING UNIT FOR A PRINTING APPARATUS

CROSS-REFERENCE TO RELATED APPLICATIONS

This application is a national stage entry of International Application No. PCT/EP2021/083995 filed on Dec. 2, 2021, which claims the benefit of priority to German Application No. 10 2020 215 577.1, filed Dec. 9, 2020, the entire disclosures of which are hereby incorporated herein by reference.

FIELD OF THE INVENTION

The invention relates to a doctoring unit for a printing apparatus for printing flat substrates, in particular circuit boards, wafers, or solar cells, comprising two doctor blades, which extend parallel to one another and are pivotably mounted.

The invention furthermore relates to a doctoring apparatus for a printing apparatus for printing flat substrates, in particular circuit boards, wafers, or solar cells, comprising a doctoring unit and comprising a drive device for operating the doctoring unit.

The invention furthermore relates to a printing apparatus for printing flat substrates, in particular circuit boards, wafers, or solar cells, comprising a doctoring apparatus, comprising a printing screen holder, on which a printing screen or a printing mask can be arranged or is arranged, and comprising a printing table, on which the substrate to be printed can be arranged on the side of the printing screen holder facing away from the doctoring apparatus.

BACKGROUND OF THE INVENTION

Printing apparatuses and doctoring units of the above-mentioned type are already known from the prior art. Doctoring units, by means of which the imprinting of predetermined patterns, for example conductor tracks or the like, is possible in high quantity in a short period of time, are used for printing flat substrates, such as circuit boards or wafers. For this purpose, the printing compound, which can also be made, for example, of an electrically conductive material, is applied to a printing screen or a printing mask, whereby the printing mask or the printing screen has openings or clearances, which correspond to the desired print image. If the doctor comprising one or several doctor blades is subsequently moved over the screen, the printing compound is thus pushed through the printing screen or the printing mask or printing stencil and is thus applied to the substrate. Doctoring units are known, which have two doctor blades, which extend parallel to one another, but are aligned so as to be inclined in opposite directions to one another, so that the one doctor blade cooperates with the printing compound when being moved in a first direction, and the second doctor bade in the opposite direction when the doctor blades are moved.

To perform a printing compound change, the doctoring unit has to be freed or cleaned, respectively, from the previously used printing compound. For this purpose, the doctor blades as well as the printing screen or the printing mask, for example, are removed from the doctoring unit and are cleaned outside of the printing apparatus. Printing compound, which remained on the doctor blades after the previous printing process, can get lost during the removal as well as during the transport of the doctoring unit. The printing compound is then lost for further printing processes no later than in the cleaning process.

BRIEF SUMMARY OF THE INVENTION

The invention is based on the object of creating an improved doctoring unit, in the case of which a printing compound loss is reduced when exchanging the doctoring unit or the printing compound.

The object on which the invention is based is solved by means of a doctoring unit comprising the features of claim 1. The doctoring unit according to the invention has the advantage that a larger quantity of printing compound can also be stored or transported securely by means of the doctoring unit, in particular even if the entire doctoring unit is released from the printing apparatus. It is attained by means of the invention that printing compound is held securely in the doctoring unit and can be supplied systematically, for example, to a reusage. The invention additionally allows for the transfer of the doctoring unit from one printing apparatus to another printing apparatus and to thereby transfer printing compound, in particular soldering paste, from one printing screen to another printing screen, also of another printing apparatus. The user thus saves material costs, avoids waste, and reduces the share of doctoring units revolving in the manufacture. If the doctoring unit can additionally be exchanged fully automatically, a higher degree of automation results in the manufacture.

According to the invention, this is attained in that the doctor blades are pivotably mounted, in particular pivotably in opposite directions, so that the doctor blade angle can be set with respect to the printing screen or the printing mask, and in that the doctor blades are operatively connected to a gearing, which is formed in a self-locking manner and can be coupled or is coupled to a drive device. By means of the gearing, the doctor angle can thus be set with the help of the drive device. Due to the fact that the doctor blades are preferably also operatively connected to one another by means of the gearing, a setting of the doctor angle of both doctor blades takes place simultaneously by means of the same gearing and the same drive device. Due to the fact that the gearing is formed in a self-locking manner, the doctor blades maintain the doctor angle, once set, in particular even if the drive device is uncoupled from the gearing. The doctor blades can thus in particular be pivoted into a transport position, in which the printing compound is optimally held back or retained in the doctoring unit, respectively, in order to accomplish an exchange of the doctoring unit or movement of the doctoring unit to a cleaning device without printing compound loss.

The doctor blades are particularly preferably arranged on the doctor frame in such a way and the gearing is formed in such a way that the doctor blades can be pivoted by means of the gearing into a V-shaped position, in which the doctor blades abut against one another on their free effective doctor edges. The effective doctor edges are thereby understood to be the longitudinal edges of the doctor blades, which are assigned to the printing screen or printing mask during operation and which press printing compound through the printing mask or the printing screen. By means of the pivoting into the V-shaped position, the doctor blades, together, enclose a V-shaped space, which is closed on its pointed end by the abutment of the effective doctor edges against one another. Printing compound located on the doctor blades can thus not escape from this space in the region of the effective doctor edges. A type of printing compound pocket is thus formed in the doctoring unit, with the help of which the printing compound can be held back securely, in order to perform, for example, a template or screen change or in order to exchange the doctoring unit as a whole.

According to a preferred embodiment of the invention, the gearing is formed as worm gearing. The self-locking of the gearing can be realized thereby securely and cost-efficiently in a simple and known manner. High setting forces can be transferred by means of the worm gearing and a high robustness against unintentional adjustment of the blade angles is ensured.

Each doctor blade is thereby preferably arranged on a respective rotatably mounted shafts for pivoting, whereby a worm wheel of the worm gearing, which engages with a worm shaft of the worm gearing that is connected or can be connected to the drive, is arranged in a rotationally fixed manner on each of the shafts. The doctor blades can thus be adjusted with the help of the gearing. An adjusting of the doctor blades, without the worm shaft being driven, however, is prevented by means of the self-locking. The shafts are preferably formed integrally in the respective doctor blade, so that the doctor blades also form the respective shaft itself, for example on their longitudinal side facing away from the effective edge of the doctor, for the purpose of which shaft stubs protrude, for example on the front sides of the respective doctor blade, which shaft stubs can be inserted into a bearing receptacle, for example of the bearing frame, for the pivotable mounting. It is thus also conceivable that the respective worm wheel is formed in one piece with the respective doctor blade and does not form a complete worm wheel in this respect, but a worm wheel, which extends over less than 360° in the circumference. According to an alternative embodiment of the invention, the respective doctor blade is pushed onto a continuous shaft and is either rotatably mounted on the shaft or the shaft is rotatably mounted in the bearing receptacle, for example of the doctor frame. In this case, the worm wheel is then either connected in a rotationally fixed manner to the doctor blade and/or in a rotationally fixed manner to the shaft.

It is furthermore preferably provided that the gearing has a drive shaft, which, on the one hand, is coupled to the worm shaft and which, on the other hand, has a coupling end, which is formed for releasably coupling the drive shaft to the drive device. The drive shaft is in particular coupled in a rotationally fixed manner to the worm shaft, so that a drive force acting on the drive shaft, in particular a drive torque, is exerted directly on the worm shaft, in order to pivot the doctor blades. The drive shaft can be releasably connected to the drive device by means of the coupling end. The doctoring unit as a whole can thus be released from the drive device in an advantageous manner, whereby the self-locking of the gearing unfolds its effect by means of the releasing and prevents a further adjusting of the doctor blades on the doctor blades themselves. A simple joining or operative connecting of the doctoring unit to the drive device is furthermore ensured by means of the coupling end.

The coupling end is particularly preferably formed as part of a frictional or positive releasable coupling, in particular as part of a frictional coupling or claw coupling. A simple joining of the coupling end to the drive device, which then preferably likewise has a shaft comprising a part of the frictional coupling or claw coupling or of the frictional or positive coupling, respectively, is ensured by means of the frictional or claw coupling.

According to a preferred further development of the invention, the doctoring unit has a housing, in or on which the gearing, the doctor carrier, and the doctor blades are held, whereby the drive shaft is guided outwards through an opening of the housing. On the one hand, the parts of the doctor blade arranged in the housing, such as the gearing, the doctor carrier, and the doctor blades, are protected against external influences by means of the housing. Due to the fact that the drive shaft protrudes from the housing, a simple coupling to the drive device is ensured. On the other hand, the drive shaft protruding from the housing can furthermore also be manually actuated by a user, in order to change the position of the doctor blades, for example for cleaning purposes, when necessary. The doctoring unit can thus be actuated manually or in an automated manner by means of a cleaning machine, for example outside the printing apparatus, in order to open the receiving pocket formed by the doctor blades and to release the printing compound contained therein.

According to a preferred further development of the invention, the doctoring unit has means for releasably fastening the doctoring unit to the drive device. The doctoring unit can thus be releasably fastened to the drive device by means of the means, whereby a simple exchange of the doctoring unit of a printing apparatus or on the drive device, respectively, is made possible. The entire doctoring unit can thus be easily released from the drive device and can be moved, for example, to another printing apparatus comprising a corresponding drive device, and can be connected to the drive device there, in order to perform a further printing process on the other printing apparatus. The doctoring unit can also be supplied to a cleaning device, released from the drive device and therefore from the printing apparatus. Means for releasably fastening are in particular understood to be means, which allow for an in particular tool-free release or fastening of the doctoring unit to the drive device in just a few steps. In this context, a screw connection, in the case of which the doctoring unit could be fastened to the drive device by means of a fastening screw, is not understood to be a means for releasably fastening, but as permanent fastening means.

The means is particularly preferably formed as locking means. The doctoring unit can thus be locked in a positive manner to the drive device through locking. The locking means preferably has one or several elastically displaceable locking elements, which can be brought into a position, which holds the doctoring unit in a positive manner on the drive device under elastic deformation. In addition, the means preferably have depressions or notches, for example formed in the housing or the drive device, in order to cooperate in a positive manner with a respective elastically displaceable locking element of the drive device or of the housing. The respective elastically displaceable or deformable locking element can thus be arranged on the doctoring unit itself or on the drive device. The depression or notch is then arranged or formed on the respective other device.

According to a preferred further development of the invention, the doctoring unit has a drive device, which has at least one drive machine, in particular electric machine, which can be coupled or is coupled to the gearing, in particular to the drive shaft of the gearing. The drive device is in particular the above-described drive device, to which the remaining doctoring unit can be releasably connected. The drive device is optionally integrated into the printing device, which in particular additionally has a printing table, on which the substrate to be printed can be arranged.

The drive machine preferably has an output shaft, which has an end that is coupled or can be coupled to the gearing. The end of the output shaft can thus be releasably connected to the coupling end of the drive shaft. Together, the coupling end and the end in particular form a coupling, which operates in a positive manner or which operates in a frictional manner, in particular a claw coupling or a frictional coupling.

The doctoring apparatus according to the invention comprising the features of claim 10 is characterized by the formation of the doctoring unit according to the invention. This results in the above-mentioned advantages. Further advantages and preferred features and feature combinations result in particular from what has been described above as well as from the claims.

The doctoring unit is or can in particular be releasably coupled to the drive device. The drive device and/or the doctoring unit in particular have the above-mentioned means for easily joining and releasing doctoring unit and drive device, in order to ensure a simple exchange of the doctoring unit. As has been described above, the means are in particular formed as locking means.

The drive device particularly preferably has a doctoring unit holder, which can be releasably connected to the doctoring unit. The doctoring unit holder in particular has the means or a portion of the means for releasably fastening the doctoring unit, so that the doctoring unit is releasably fastened or can be fastened to the frame holder. The doctoring unit holder thus represents the interface between doctoring unit and drive device and serves the purpose of receiving and storing the doctoring unit. The releasable connection is in particular designed as described above, in particular comprising at least one elastically deformable or displaceable locking element.

The doctoring unit holder is preferably pivotably mounted about a center axis, which is aligned parallel to the shafts of the doctoring unit. By pivoting the doctoring unit holder about the center axis, a pivoting of the doctoring unit, which is fastened to the doctoring unit holder, thus also takes place, whereby the doctoring unit can be optimally adapted to the printing, which is to be performed, during a printing process. The doctoring unit holder is in particular pivoted in the one or in the other direction as a function of the direction in which the doctor blades be moved, in order to attain an optimal doctoring result.

A controllable actuator for pivoting the doctoring unit holder is particularly preferably assigned to the doctoring unit holder on at least one protrusion of the doctoring unit holder, which is spaced apart from the center axis. The doctoring unit holder can thus be influenced or set, respectively, in its pivot position by means of the actuator, in order to attain the precise printing result. The doctoring unit holder optionally has protrusions, which are arranged at a distance on both sides of the center axis and to which a controllable actuator is assigned in each case.

The actuator is particularly preferably formed as pneumatic actuator comprising a lifting piston, which is assigned to the protrusion and which acts on the protrusion in particular tangentially to the center axis. With the formation of the actuator as pneumatic actuator, the actuator obtains an elasticity by means of the compressible pneumatic medium. It is thus ensured that the doctoring unit can be pivoted or moved against the force of the actuator in the event that an excessive resistance occurs when moving the doctor blades, so that damage to the doctor blades is securely avoided. The pneumatic actuator thus acts on the doctor frame in the manner of a bias. The entire doctoring unit can hereby in particular be displaced in a pivotable manner against the biasing force of the actuator.

The printing apparatus according to the invention is characterized by the formation of the doctoring apparatus according to the invention. The doctoring unit is in particular fastened or can be fastened in an exchangeable manner to the drive device, by means of the above-mentioned means. Together with the doctoring device, the doctoring unit in particular forms the print head of the printing apparatus. In addition, a printing system is preferably created, in the case of which several printing apparatuses are present, which each have a drive device, to which the doctoring unit according to the invention can be fastened.

BRIEF DESCRIPTION OF THE DRAWINGS

Further advantages and preferred features and feature combinations follow in particular from what has been described above as well as from the claims. The invention will be described in more detail below on the basis of the drawings, in which

DESCRIPTION OF EXAMPLE EMBODIMENTS

Figure 1:
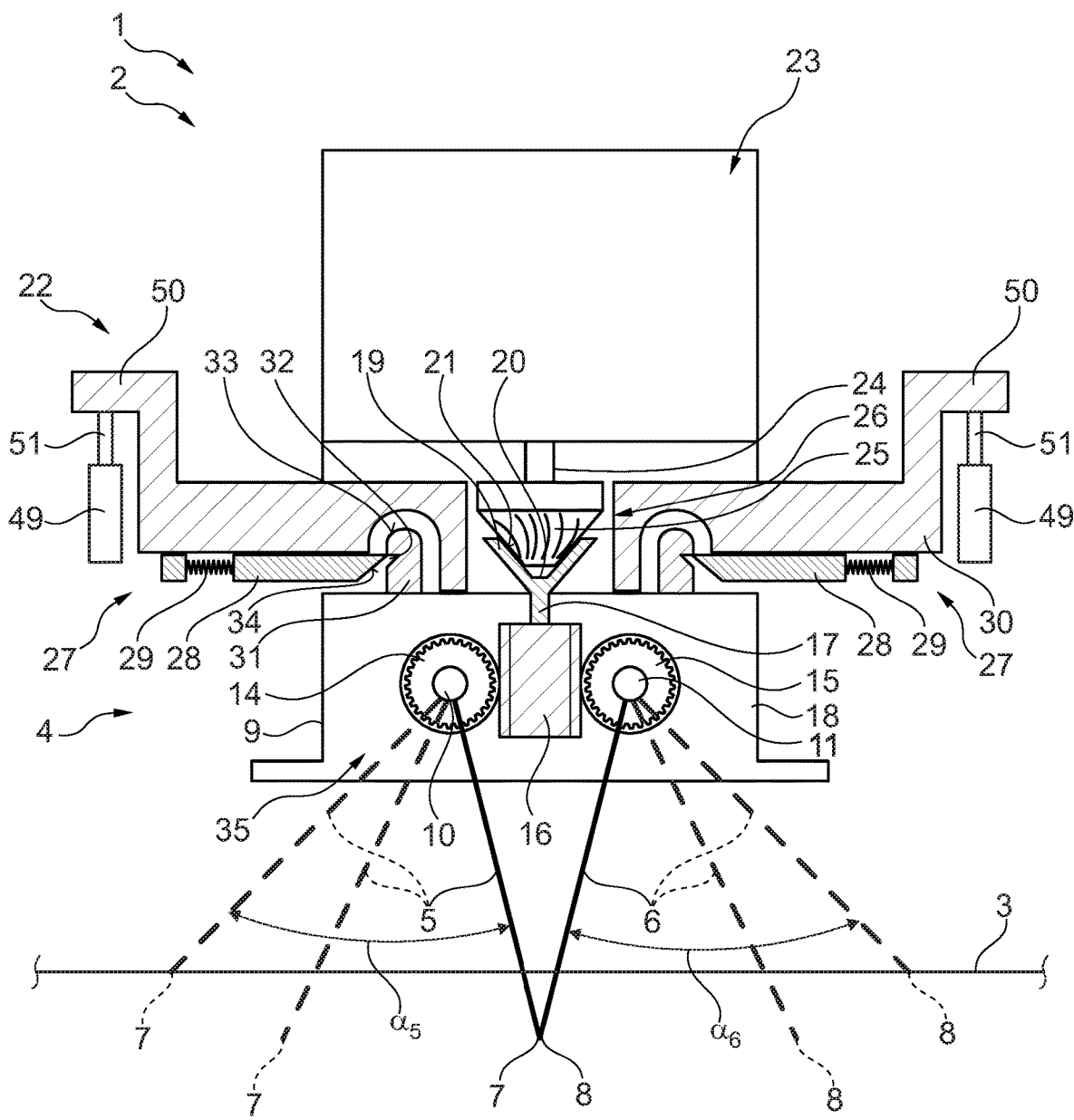
FIG. 1 shows an advantageous doctoring apparatus for a printing apparatus in a simplified side view.

FIG. 1 shows an advantageous doctoring apparatus 1 for a printing apparatus 2, which is not illustrated in more detail here, for printing flat substrates, in particular circuit boards, wafers, or the like, in a simplified side view. The doctoring apparatus 1 is formed to press printing compound through openings or structures of a printing screen 3, which is only suggested in FIG. 1, and to thus apply it to one or several substrates located below the printing screen 3.

For this purpose, the doctoring device 1 has a doctoring unit 4, which carries two doctor blades 5, 6. In FIG. 1, the doctor blades 5, 6 extend perpendicular to the image plane, whereby the doctor blades 5, 6 are each held with a longitudinal edge on a doctor carrier 9 of the doctoring unit 4 and, on the longitudinal edge thereof, which faces away from this longitudinal edge, form an effective edge 7, 8 of the doctor, which serves the purpose of sweeping over the printing compound or the printing screen 3, respectively. The doctor blades 5, 6 can be made of metal or plastic and can be formed to be stiff or slightly elastically deformable.

Figure 2:
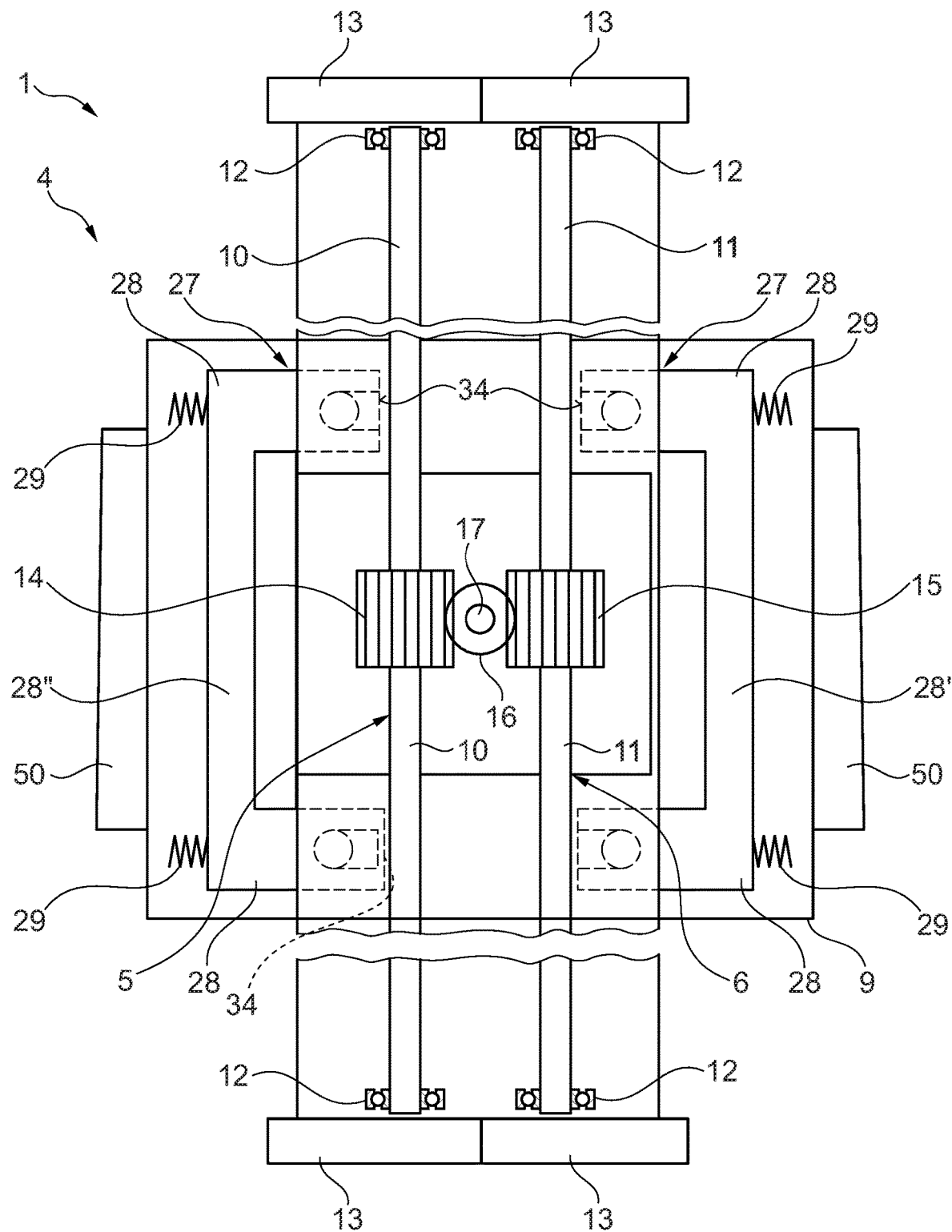
FIG. 2 shows the doctoring device in a top view.

FIG. 2 shows the doctoring unit 4 in a simplified top view. The doctoring unit 4 has the doctor carrier 9, on which the doctor blades 5, 6 are pivotably mounted. For this purpose, the doctor blades 5, 6 are each connected to a rotatably mounted shaft 10, 11 or are fastened thereto in a rotationally fixed manner, respectively, in each case on their end facing away from the effective edge 7, 8 of the doctor, so that a rotation of the respective shaft 11, 10 leads to a corresponding adjustment of the doctor angle $\alpha_5$ or $\alpha_6$, respectively, of the respective doctor blade 5, 6, as shown in FIG. 1. The shafts 10, 11 have radial slits, for example, in which the doctor blades 5, 6 are held so as to be inserted.

As shown in FIG. 2, the shafts 10, 11 are advantageously rotatably mounted by means of several rolling body bearings 12, so that a rotation takes place with small friction losses. Paste limiters 13, which prevent that the applied printing paste escapes laterally past the doctor blades 5, 6 when sweeping over the printing screen 3, are optionally assigned to the doctor blades 5, 6 on the front side.

The shafts 10, 11 each carry a worm wheel 14, 15, which is connected in a rotationally fixed manner to the respective shaft 10, 11. The worm wheels 14, 15 are in particular arranged in the center on the shafts 10, 11, viewed in the longitudinal extension of the shafts 10, 11, as shown in FIG. 2. The worm wheels 14, 15 thus lie parallel to one another. A worm shaft 16, which meshes or engages with the two worm wheels 14, 15, respectively, is arranged between the worm wheels 14, 15. The worm shaft 16 is rotatably mounted on the doctor carrier 9 by means of a further roller body bearing 12. For this purpose, the worm shaft 16 merges into a drive shaft 17, is thus formed in one piece with the latter, which passes through a housing 18, which is arranged on the doctor carrier 9, in the region of the roller body bearing and protrudes outwards from the housing 18. The doctor carrier 9 optionally forms the housing 18. The housing 18 is formed in a trough-shaped manner, as shown in an exemplary manner in FIG. 1, whereby the drive shaft 17 passes through the bottom of the trough shape, and surrounds at least the shafts 10, 11 as well as the worm wheels 14, 15, so that the latter are protected against external influences. On its end facing away from the drive shaft 17, the housing 18 is formed to be open, so that the doctor blades 5, 6 emerge from the housing 18 and can be pivoted, as shown in FIG. 1.

On its end facing away from the worm shaft 16, the drive shaft 17 has a coupling end 19. The coupling end 19 is characterized in that it has an outer diameter, which increases with increasing distance from the worm shaft 16 and has a depression 20 on its free front side, so that the coupling end 19 is formed in the manner of a hollow shaft, which widens in a V-shaped manner, viewed in the longitudinal section. This results in a type of funnel shape of the coupling end 19. On its inner side 21, the coupling end 19 advantageously has an entraining structure, for example in the form of ridges, grooves, protrusions, or teeth. According to an alternative exemplary embodiment, the drive shaft 17 does have depressions 20, but it does not widen on its outer side, so that an in particular V-shaped depression 20 is formed on the front side, and the jacket outer wall of the shaft remains cylindrical in the region of the coupling end 19.

The doctoring apparatus 1 furthermore has a drive device 22, which is arranged above the doctoring unit 4, as shown in FIG. 1. The drive device 22 has, for example, an electric motor 23, which is connected directly or by means of a gearing to an output shaft 24. The output shaft 24 protrudes from a housing of the electric motor 23 in the direction of the doctoring unit 4 and has an end 25, which serves the purpose of being releasably connected to the coupling end 19 of the doctoring unit 4. For this purpose, the end 25 is preferably formed complementary to the coupling end 19, according to the present exemplary embodiment as truncated cone, the cone angle of which corresponds approximately to the opening angle of the V-shaped coupling end 19, the truncated cone angle is preferably slightly smaller. The coupling end 19 can thus be easily pushed onto the end 25 of the output shaft 24. Together with the end 25, the coupling end 19 in particular forms a releasable coupling 26. The coupling 26 is in particular formed as frictional coupling. Alternatively, the coupling 26 is formed as claw coupling or positively-acting coupling. In particular the ridges, teeth, or grooves, which are optionally formed on the inner side 21 and which come into engagement with corresponding protrusions, ridges, grooves, or teeth of the end 25, serve this purpose. A positive torque transmission from the drive device 22 to the worm shaft 16 is then ensured.

According to a further exemplary embodiment, the depression 20 is formed in the end 25, and the coupling end 19 has a truncated cone, which is complementary thereto. It is also conceivable that both the end 25 and the coupling end 19 each have a flat front side in a plane perpendicular to the axis of rotation, which are pressed against one another, for example for forming the frictional coupling, or which likewise have a toothing for the positive torque transmission or torque transfer.

Figure 3:
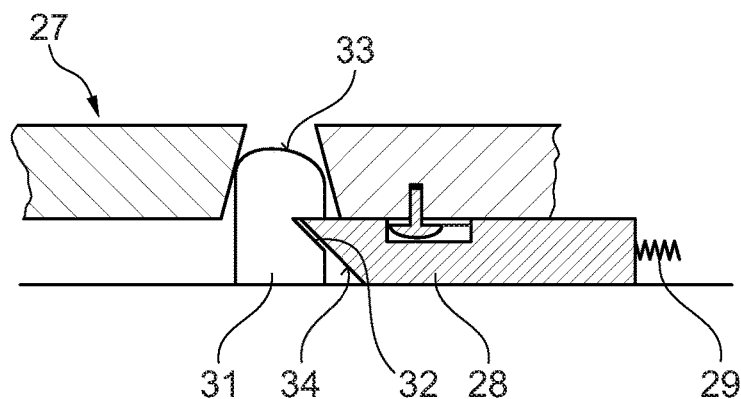
FIG. 3 shows a detail view of the doctoring device.

A simple removal of the doctoring unit 4 from the drive device 22 is possible by means of the releasable coupling 26. Means 27 for releasably connecting the doctoring unit 4 to the drive device 2 are furthermore present for this purpose. These will be described in more detail below with reference to FIGS. 1 and 3. FIG. 3 thereby shows an enlarged detail view of the means 27.

In the present case, the means 27 have several elastically displaceable locking elements 28. According to the present exemplary embodiment, they are arranged on the drive device 22 and are mounted in a laterally movable manner or parallel to the plane of the printing screen 3, respectively. The locking elements 28 are formed in the form of locking wedges, to which a spring force is applied in the direction of the output shaft 24 by means of a respective bias spring 29. In the present case, at least two locking elements 28 are mounted so as to be located opposite one another on a doctoring unit holder 30 of the drive device 22, to which the doctoring unit 4 is releasably fastened by means of the means 27.

The doctoring unit 4 has a number of counter locking element 31 corresponding to the number of the locking elements 28. The counter locking elements 31 are fastened, for example, in the frame and/or the housing 18 and protrude from the housing 18 essentially parallel to the drive shaft 17. The counter locking elements 31 thereby each have a lateral notch 32, whereby the notches 32 of the opposite counter locking elements 31 face away from one another and thus face the respective locking element 28. The notches 32 are formed to be so large that they can receive a section of the respective locking element 28, as shown in particular in FIG. 3. On their front side facing away from the housing 9, the counter locking elements 31 have an insertion slope 33 or run-on slope, by means of which the respective locking element 28 is pushed back against the force of the bias spring 29 when supplying the doctoring unit 4 to the drive device 22. To facilitate the displacement, the locking elements 28 likewise each have a run-on slope 34 or insertion slope, which cooperates with the insertion slope 33 of the respective locking element 31.

In the present case, two locking elements 28 are in each case connected to one another in the present case by means of a transverse web 28', so that U-shaped locking elements result, as can be gathered from FIG. 2.

As soon as the counter locking element 33 or the doctoring unit 4, respectively, is guided sufficiently far in the direction of the drive device 22, so that the end 25 and the coupling end 19 come into operative connection with one another and the respective locking element 28 lies completely at the height of the notch 32, the respective locking element 28 is inserted into the respective notch by means of the spring force of the bias spring 29. The doctoring unit 4 is thus held in a positive manner on the drive device 22 and is operatively connected to the electric motor 23 by means of the coupling 26. To release the doctoring unit 4 from the drive device 22, the locking elements 28 are pushed back against the force of the respective bias spring 29 and are thus removed from the respective notch 33, whereafter the doctoring unit 4 can easily be withdrawn downwards from the drive device 22. The operative connection between coupling end 19 and output shaft 24 is thereby likewise released without further measures, in particular in a tool-free manner. Due to the fact that the gearing 35 formed of worm wheels 13, 14 and worm shaft 16 is self-locking, the doctor blades 5, 6 remain in their last set pivot position after removal of the doctoring unit 4 from the drive device 22. A user can then also manually change the pivot position on the doctoring unit 4 by manually applying a torque to the coupling end 19.

Prior to releasing the doctoring unit 4 from the drive device 22, the doctor blades 5, 6 are advantageously moved into a transport position, in which the doctor blades are arranged so as to be inclined to one another in a V-shaped manner, so that their free doctor edges 7, 8 abut against one another, as shown in FIG. 1. FIG. 1 shows the doctor blade in the V-shaped transport position by means of solid lines and in further exemplary doctor positions by means of dashed lines.

Due to the self-locking of the gearing 35, it is ensured that the doctor blades 5, 6 remain in the transport position, so that printing compound optionally located between the doctor blades 5, 6 is received and stored between the doctor blades. The printing compound cannot leave the space formed between the doctor blades 5, 6 and the lateral paste limiters 13 during the transport of the doctoring unit 4. A secure transport of the printing compound or paste, respectively, is thus ensured, which makes it possible, for example, to move the doctoring unit 4 without printing compound losses from one printing table to another printing table or from a printing table to a cleaning device, in which the printing compound, which is still present, can then be removed systematically and can be prepared for reuse. The consumption of printing compound is thus reduced as a whole. Due to the releasable fastening of the doctoring unit 4 on the drive device 22, by means of which an operative connection between the gearing 35 and the drive device 22 is also created automatically, a manual as well as an automated attachment of the doctoring unit 4 to the drive device 22 as well as a release therefrom can be performed within a short period of time and in a secure manner.

Figure 4A:
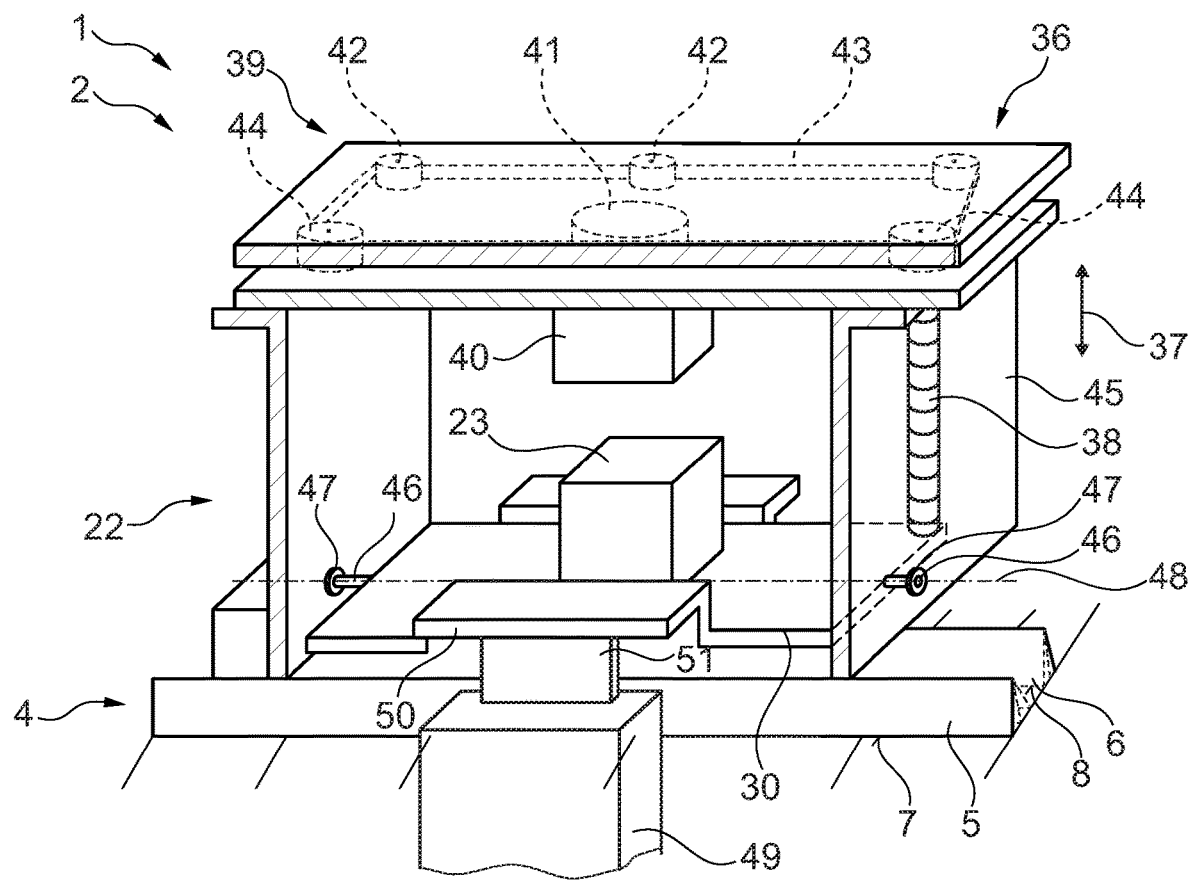
FIGS. 4A to 4C show a lifting apparatus of the doctoring device in different views.

FIG. 4A shows the doctoring device 1 in a simplified perspective illustration. In this illustration, a lifting apparatus 36 of the printing apparatus 2 is additionally shown, by means of which the drive device can be lowered or raised as a whole, as shown by means of a double arrow 37.

Figure 4B:
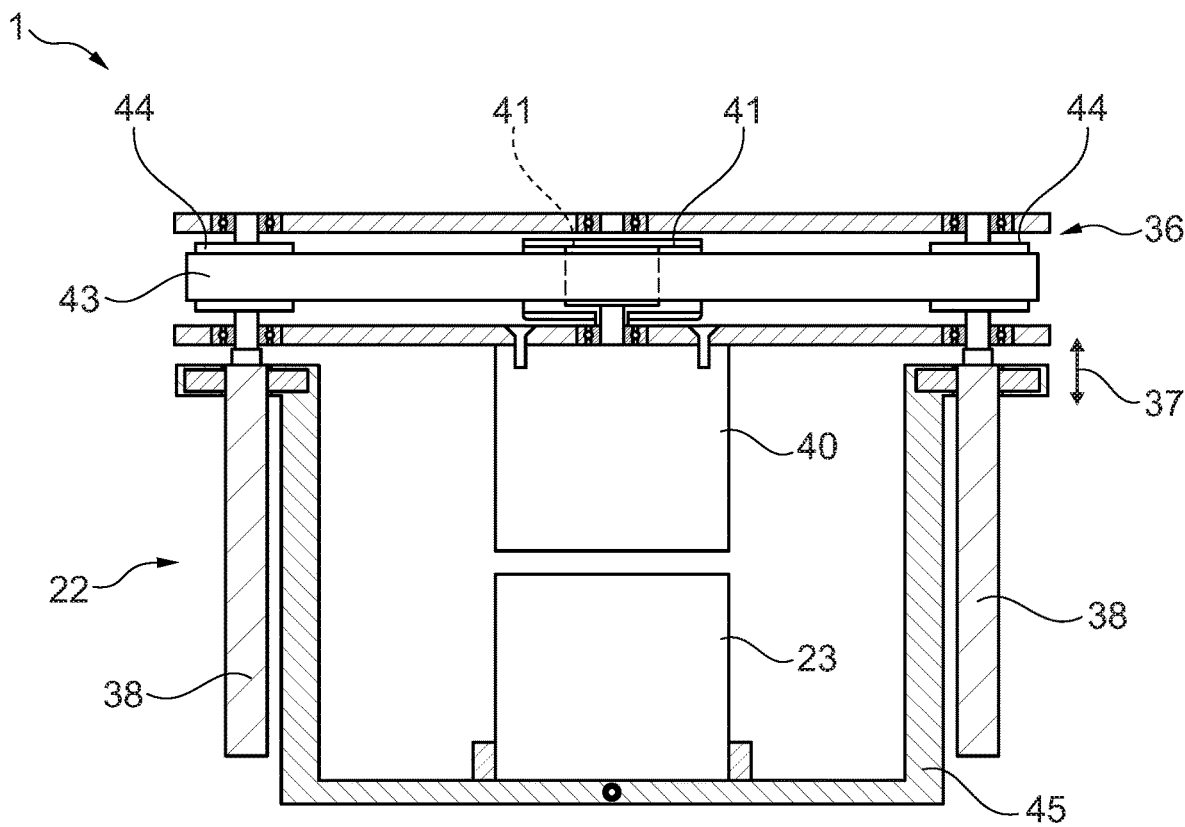
Figure 4C:
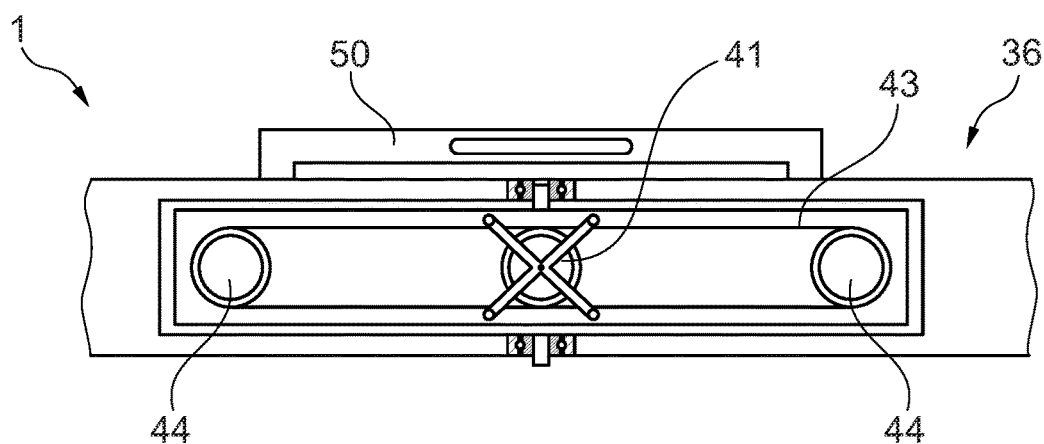

FIG. 4B shows the lifting apparatus 36 in a side view of the doctoring apparatus 1 and FIG. 4C shows a simplified top view onto the lifting apparatus 36.

The lifting apparatus 36 is formed as spindle lifting apparatus, which, according to the present exemplary embodiment, has two lifting spindles 38, which are each guided through a thread of a carrier 45 of the drive device 22, so that the drive device is moved in a translatory manner or axially along the lifting spindle 38, respectively, in response to a rotation of the respective lifting spindle 38. To drive the lifting spindle 38, in particular a belt drive 39 is used, which has a drive motor 40, in particular electric motor, which is operatively connected to a drive wheel 41, as well as a belt 43, which is guided around several guide rollers 42, at least one of which is preferably arranged in a radially elastically displaceable manner, as well as around/ on rollers 44 fastened to the lifting spindles 38 on the end side, so that the torque of the drive motor 40 can be transferred to the lifting spindles 38 by means of the belt 43. The drive device 22 comprising the doctoring unit 4 arranged therein can thus be moved down onto a printing screen or a printing stencil or can be released therefrom with the help of the lifting apparatus 36.

The doctoring unit holder 30 is pivotably held on the carrier 45 of the drive device 22. On two front sides facing away from one another, the doctoring unit holder 30 has, for this purpose, a respective bearing bolt 46, which is inserted in a rotatably mounted manner in a bearing receptacle 47 of the carrier 45. The entire doctoring unit holder 30 is thus pivotably mounted about an axis, which in particular, as shown in FIG. 4A, is a center axis 48 and which in particular extends parallel to the axes of rotation of the shafts 10, 11. The center axis 48 thereby intersects in particular the central longitudinal axis of the worm shaft 16. By pivoting the doctoring unit holder 30, the doctoring unit 4, which is connected thereto by means of the locking means 27, is also pivoted, and the doctor blades 5, 6 by means of the doctoring unit. An optimal doctor angle setting is ensured hereby during the printing operation.

At least one pneumatic actuator 49 is present for pivoting the doctoring unit holder 30, as shown in an exemplary manner in FIGS. 1 and 4A. The doctoring unit holder 30 has two protrusions 50 facing away from one another, which are each arranged on the longitudinal sides of the doctoring unit holder extending parallel to the center axis 48 and which protrude laterally, thus resulting in an L-shape. According to the present exemplary embodiment, a pneumatic actuator 49 is assigned to these protrusions in each case. Each of the pneumatic actuators has a pneumatic piston 51, which cooperates with the protrusion 50 and which is movably mounted in a pneumatic cylinder, in particular tangentially to the center axis 48. By controlling the actuators, the doctoring unit holder and thus the doctoring unit 4 can be pivoted systematically about the center axis 48.

It is ensured by means of the pneumatic application of force onto the doctoring unit holder 30 that an elasticity is provided by means of the pneumatic medium, which makes it possible to pivot the doctoring unit holder 30 opposite to the actuating direction. The doctoring unit 4, for example, can thus be pivoted against the force of the actuator 49 when one of the doctor blades 5 or 6 meets an insurmountable object. The doctor blades 5, 6 can thus be preserved and a long service life can be guaranteed for the doctoring unit 4.

The invention claimed is:

1. A doctoring unit for a printing apparatus for printing flat substrates, comprising two doctor blades, which extend parallel to one another and are pivotably mounted, wherein the doctor blades are operatively connected to a gearing and by means of the gearing, which is formed in a self-locking manner as worm gearing and can be coupled or is coupled to a drive device, wherein the gearing has a drive shaft, which, on the one hand, is coupled to a worm shaft and which, on the other hand, has a coupling end, which is formed for releasably coupling the drive shaft to the drive device.

2. The doctoring unit according to claim 1, wherein the doctor blades can be pivoted by the means of the gearing into a V-shaped transport position, in which the doctor blades abut against one another on their free effective doctor edges.

3. The doctoring unit according to claim 1, wherein each doctor blade is arranged on a respective rotatably mounted shaft for pivoting, whereby a worm wheel, which engages with the worm shaft that is connected or can be connected to the drive device, is arranged in a rotationally fixed manner on each of the shafts.

4. The doctoring unit according to claim 1, wherein the coupling end is formed as part of a positive or frictional coupling.

5. The doctoring unit according to claim 1, wherein the doctoring unit has a housing, in or on which the gearing, a doctor carrier, and the doctor blades are held, whereby the drive shaft is guided outwards through an opening of the housing.

6. The doctoring unit according to claim 1, wherein the doctoring unit has means for releasably fastening to the drive device.

7. The doctoring unit according to claim 1, wherein the means is formed as locking means.

8. A doctoring apparatus for a printing apparatus for printing flat substrates, comprising a doctoring unit and a drive device for the doctoring unit, wherein the formation of the doctoring unit according to claim 1.

9. The doctoring apparatus according to claim 8, wherein the drive device has an electric machine, which can be coupled to the gearing.

10. The doctoring apparatus according to claim 8, wherein the drive device has an output shaft, which has an end that is coupled or can be coupled to the gearing.

11. The doctoring apparatus according to claim 10, wherein the end of the output shaft is formed for releasably coupling to the drive shaft of the gearing.

12. The doctoring apparatus according to claim 8, wherein the drive device has a doctoring unit holder, and with means for releasably fastening the doctoring unit to the doctoring unit holder.

13. The doctoring apparatus according to claim 12, wherein the means for releasably fastening have at least one elastically deformable or displaceable locking element.

14. The doctoring apparatus according to claim 12, wherein the doctoring unit holder is pivotably mounted about a center axis, which extends parallel to the shafts.

15. The doctoring apparatus according to claim 14, wherein a controllable actuator for pivoting the doctoring unit holder is assigned to the doctoring unit holder on at least one protrusion, which is spaced apart from the center axis.

16. The doctoring apparatus according to claim 15, wherein the actuator is formed as a pneumatic actuator comprising a lifting piston, which is assigned to said at least one protrusion and which can be displaced tangentially to the center axis.

17. A printing apparatus for printing flat substrates, comprising the doctoring apparatus according to claim 8.

18. A doctoring unit for a printing apparatus for printing flat substrates, comprising two doctor blades, which extend parallel to one another and are pivotably mounted, wherein the doctor blades are operatively connected to a gearing and by means of the gearing, which is formed in a self-locking manner as worm gearing and can be coupled or is coupled to a drive device, wherein the drive device has a doctoring unit holder, which can be releasably connected to the doctoring unit, wherein a controllable actuator for pivoting the doctoring unit holder is assigned to the doctoring unit holder on at least one protrusion, which is spaced apart from a center axis, and wherein the actuator is formed as a pneumatic actuator comprising a lifting piston, which is assigned to said at least one protrusion and which can be displaced tangentially to the center axis.

* * * * *